(12) United States Patent
Aronson et al.

(10) Patent No.: US 6,878,875 B2
(45) Date of Patent: Apr. 12, 2005

(54) SMALL FORM FACTOR OPTICAL TRANSCEIVER WITH EXTENDED TRANSMISSION RANGE

(75) Inventors: Lewis B. Aronson, Los Altos, CA (US); Giorgio Giaretta, Mountain View, CA (US); Stefano Schiaffino, Menlo Park, CA (US); Dev E. Kumar, San Jose, CA (US); T. G. Beck Mason, San Jose, CA (US)

(73) Assignee: Finisar Corporation, Sunnyvale, CA (US)

( * ) Notice: Subject to any disclaimer, the term of this patent is extended or adjusted under 35 U.S.C. 154(b) by 0 days.

(21) Appl. No.: 10/748,051

(22) Filed: Dec. 30, 2003

(65) Prior Publication Data

US 2004/0151505 A1 Aug. 5, 2004

Related U.S. Application Data

(63) Continuation of application No. 10/629,253, filed on Jul. 28, 2003, which is a continuation-in-part of application No. 10/625,022, filed on Jul. 23, 2003, and a continuation-in-part of application No. 10/231,395, filed on Aug. 29, 2002, now Pat. No. 6,703,561, which is a continuation-in-part of application No. 10/077,067, filed on Feb. 14, 2002, now Pat. No. 6,586,678.
(60) Provisional application No. 60/477,868, filed on Jun. 12, 2003.

(51) Int. Cl.[7] .................................................. H05K 5/00
(52) U.S. Cl. ........................ 174/50; 174/52.1; 174/52.5; 257/732; 361/714
(58) Field of Search .............................. 174/52.1, 52.5, 174/50; 361/519, 537, 714, 717; 257/732, 733

(56) References Cited

U.S. PATENT DOCUMENTS

| | | | |
|---|---|---|---|
| 3,987,676 A | | 10/1976 | Bennewitz |
| 4,128,697 A | | 12/1978 | Simpson |
| 4,375,578 A | | 3/1983 | Mitchell et al. |
| 4,769,684 A | | 9/1988 | Crocker et al. |
| 5,212,345 A | | 5/1993 | Gutierrez |
| 5,545,846 A | | 8/1996 | Williams et al. |
| 6,118,072 A | * | 9/2000 | Scott ..................... 174/52.5 X |
| 6,439,918 B1 | * | 8/2002 | Togami et al. .............. 439/372 |
| 6,734,658 B1 | * | 5/2004 | Bierer ........................ 324/115 |

* cited by examiner

*Primary Examiner*—Dhiru R. Patel
(74) *Attorney, Agent, or Firm*—Workman Nydegger

(57) ABSTRACT

A small form factor transceiver module that incorporates an externally modulated laser (EML). The transceiver module has a transmitter optical subassembly with a header assembly having a base with a platform extending through. The platform has a plurality of conductive traces extending through the platform for making connections on both sides of the base. A thermoelectric cooler (TEC) is used to dissipate heat from a laser within the header assembly. The TEC dissipates heat sufficiently to allow the EML to be used in the header assembly. In this manner, EMLs can be used in relatively small optical devices, including small form factor transceivers that comply with the XFP standard. The XFP modules with EMLs can be used for longer links than XFPs without EMLs. In addition, EMLs can be stabilized using TECs so that XFP modules can be used for DWDM-type applications.

12 Claims, 9 Drawing Sheets

SMALL FORM FACTOR OPTICAL TRANSCEIVER WITH EXTENDED TRANSMISSION RANGE

CROSS-REFERENCE TO RELATED APPLICATIONS

This application is a continuation application of U.S. patent application Ser. No. 10/629,253, filed Jul. 28, 2003, entitled "Small Form Factor Transceiver with Externally Modulated Laser", which is a continuation-in-part of U.S. patent application Ser. No. 10/625,022, filed Jul. 23, 2003, entitled "Multi-Layer Ceramic Feedthrough Structure in a Transmitter Optical Subassembly", which claims the benefit of U.S. Provisional Patent Application Ser. No. 60/477,868, filed Jun. 12, 2003 and is also a continuation-in-part of application Ser. No. 10/231,395, filed Aug. 29, 2002, now U.S. Pat. No. 6,703,561 which is a continuation-in-part of application Ser. No. 10/077,067, filed Feb. 14, 2002, now U.S. Pat. No. 6,586,678, entitled "Ceramic Header Assembly." The foregoing patent applications and patents are incorporated herein by reference.

BACKGROUND OF THE INVENTION

1. Technological Field

This invention is generally concerned with the field of opto-electronic systems and devices. More specifically, embodiments of the present invention relate to a transistor header that includes various features directed to the enhancement of the reliability and performance of various electronic devices, such as lasers, included in the transistor header.

2. Related Technology

Fiber-optic and opto-electronics have become important components in modern networking circuits. Using fiber-optic circuits allows for efficient, accurate and quick transmission of data between various components in a network system.

As with the design of most any system, there are engineering tradeoffs that often have to be made when implementing fiber optic systems. For example, the size and modularity of components must often be balanced against the need for additional space to accommodate heat dissipation and circuit monitoring components. While it is desirable to minimize a component's size, some configurations have previously limited this minimization due to their inherent characteristics. For example, previously many lasers used in fiber-optic systems that have the characteristics needed for long-distance transmission and/or dense wavelength division multiplexing (DWDM) generated amounts of heat that could not be dissipated by some smaller package sizes. Further, smaller package sizes have a limited amount of space available for mounting and connecting additional components such as thermistors, monitor photodiodes, thermoelectric coolers, or impedance matching circuits.

Regarding smaller package sizes, it is desirable in fiber optic systems to use modular components so that a system can be created in a compact area and with as little expensive customization as possible. For example, many fiber optic systems are able to use modular transceiver modules. The modular transceiver modules include an input receiver optical subassembly (ROSA) and an output transmitter optical subassembly (TOSA). The ROSA comprises a photodiode for detecting optical signals and sensing circuitry for converting the optical signals to digital signals compatible with other network components. The TOSA comprises a laser for transmitting optical signals and control circuitry for modulating the laser according to an input digital data signal. The TOSA has an optical lens for collimating the light signals from the laser of the TOSA to an optical fiber. Additionally, the transceiver module includes pluggable receptacles for optically connecting the TOSA and the ROSA with other components within a fiber optic network.

The transceiver module often includes an electronic connector for connection to electrical components of the computer or communication device with which the transceiver module operates (a "host system"). The design of the transceiver, as well as other components within the fiber optic system, is standards-based, such that components can be connected without significant customization.

One particular pluggable standard that is currently being developed is the 10-Gigabit Small Form-factor Pluggable (XFP) standard. This standard defines various characteristics such as size, power consumption, connector configuration, etc. With regards to power consumption, the XFP standard references three power consumption levels of 1.5 W, 2.5 W and 3.5 W. When designing devices to operate within the XFP standard, attention must be given to what components are selected and how they are configured so as to not exceed the rated power consumption. These devices are constrained by principles of semiconductor physics to work preferentially in a certain temperature range. The module power dissipation and the package size and materials uniquely determine the module operating temperature for given ambient conditions, such as ambient temperature, airflow, etc. The resulting module operating temperature determines the types of optical and electronic components that can be successfully operated within the package. One such package is known as a transistor-outline header, otherwise known as a TO can or TO.

Transistor-outline headers are widely used in the field of opto-electronics, and may be employed in a variety of applications. As an example, transistor headers are sometimes used to protect sensitive electrical devices, and to electrically connect such devices to components such as printed circuit boards ("PCB").

With respect to their construction, transistor headers often consist of a cylindrical metallic base with a number of conductive leads extending completely through, and generally perpendicular to, the base. With regard to the metallic base, the size of the base is often sized to fit within a specific TO standard size and lead configuration, examples of which include a TO-5 or TO-46. The leads are hermetically sealed in the base to provide mechanical and environmental protection for the components contained in the TO package, and to electrically isolate the conductive leads from the metallic material of the base. Typically, one of the conductive leads is a ground lead that may be electrically connected directly to the base.

Various types of devices are mounted on one side of the base of the header and connected to the leads. Generally, a cap is used to enclose the side of the base where such devices are mounted, so as to form a chamber that helps prevent contamination or damage to those device(s). The specific characteristics of the cap and header generally relate to the application and the particular device being mounted on the base of the header. By way of example, in applications where an optical device is required to be mounted on the header, the cap is at least partially transparent so to allow an optical signal generated by the optical device to be transmitted from the TO package. These optical TO packages are also known as window cans.

Although transistor headers have proven useful, typical configurations nevertheless pose a variety of unresolved problems. Some of such problems relate specifically to the physical configuration and disposition of the conductive leads in the header base. As an example, various factors combine to compromise the ability to precisely control the electrical impedance of the glass/metal feedthrough, that is, the physical bond between the conductive lead and the header base material. One such factor is that there is a relatively limited number of available choices with respect to the diameter of the conductive leads that are to be employed. Further, the range of dielectric values of the sealing glass typically employed in these configurations is relatively small. And, with respect to the disposition of the conductive leads, it has proven relatively difficult in some instances to control the position of the lead with respect to the through hole in the header base.

Yet other problems in the field concern those complex electrical and electronic devices that require many isolated electrical connections to function properly. Typically, attributes such as the size and shape of such devices and their subcomponents are sharply constrained by various form factors, other dimensional requirements, and space limitations within the device. Consistent with such form factors, dimensional requirements, and space limitations, the diameter of a typical header is relatively small and, correspondingly, the number of leads that can be disposed in the base of the header, sometimes referred to as the input/output ("I/O") density, is relatively small as well.

Thus, while the diameter of the header base, and thus the I/O density, may be increased to the extent necessary to ensure conformance with the electrical connection requirements of the associated device, the increase in base diameter is sharply limited, if not foreclosed completely, by the form factors, dimensional requirements, and space limitations associated with the device wherein the transistor header is to be employed.

A related problem with many transistor headers concerns the implications that a relatively small number of conductive leads has with respect to the overall performance of the device and the need to connect additional circuitry required by certain types of laser when the transistor header is used. Semiconductor lasers circuits operate more efficiently when the circuit driving the semiconductor laser has an impedance that is equal to the impedance of the laser itself. There is a special need for impedance matching and load balancing when circuits are operating at relatively high frequencies, such as is the case in many semiconductor laser communication circuits. Mismatched circuits may cause transmission line reflections and a corresponding inability to maximize the power delivered to the semiconductor laser. Additionally, transmission line reflections can cause intensity noise and phase noise that results in transmission penalties in the fiber-optic circuit. Impedance matching is often accomplished through the use of additional electrical components such as resistors, capacitors, inductors, and transmission lines such as microstrips, striplines, or coplanar waveguides. However, such components cannot be employed unless a sufficient number of conductive leads are available in the transistor header. Thus, the limited number of conductive leads present in typical transistor headers has a direct negative effect on the performance of the semiconductor laser or other device.

In connection with the foregoing, another aspect of many transistor headers that forecloses the use of, for example, components required for impedance matching, is the relatively limited physical space available on standard headers. In particular, the relatively small amount of space on the base of the header imposes a practical limit on the number of components that may be mounted thereon. To overcome that limit, some or all of any additional components desired to be used must instead be mounted on the printed circuit board, some distance away from the laser or other device contained within the transistor header. Such arrangements are not without their shortcomings however, as the performance of active devices in the transistor header, such as lasers and integrated circuits, depends to some extent on the physical proximity of related electrical and electronic components. By minimizing the distance between the lasers and integrated circuits to the additional components required for impedance matching, the inherent transmission line between such components is minimized. As such, placing the components in close physical proximity reduces reflective transmission line losses.

Even when a sufficient number of contacts are available to connect external components to the laser for impedance matching, other problems arise. For example, one of the simplest methods of impedance matching is by shunting a resistive impedance across the laser source wherein the shunting impedance matches the impedance of the laser. The problem with this solution is that it adds an additional load to the power supply where the additional load is the shunt resistor and thus wastes power and generates heat.

In one example, suppose that a laser has a 25 ohm load impedance and a laser driver has a 12.5 ohm source impedance. To match the laser impedance, a 25 ohm resistor is shunted across the laser. This results in a 12.5 ohm load for the laser driver that, while impedance matched, requires more power to drive than if the laser driver only needed to drive a 25 ohm load. One way to eliminate the need for external components is to create an appropriately designed transmission line that transmits the laser signal from the laser driver to the laser itself, with proper characteristic impedance to match the laser and the laser driver. In this way, the laser driver efficiently supplies power to the 25 ohm load while minimizing harmful reflections. Such transmission lines are often appropriately sized microstrips, striplines, or coplanar waveguides, etc., formed on a printed circuit board using the characteristics of the conductive materials on the circuit board and the substrate on which the conductive materials are placed. As such, whereas transistor headers do not have internal printed circuit boards available, such matching transmissions lines cannot be constructed.

In addition to the need for matching circuits, there is also often a need for other additional circuitry. For example, an externally modulated laser (EML) comprises a laser and a semiconductor modulator. Examples of lasers that can be used with EMLs include a distributed feedback (DFB) laser or a distributed Bragg reflector (DBR) laser. Examples of modulators include an electroabsorptive modulator, in which the modulator absorbs light depending on a control voltage, or various interferometric modulators, such as the Mach-Zehnder modulator, often made with lithium niobate. An eternally modulated laser having an electroabsorptive modulator can be referred to as an EA EML (electroabsorbtive externally modulated laser). The integrated modulator has additional connections that require control signals from devices external to the transistor header that are normally not required when a laser without the integrated modulator is included. As such, without additional connections, lasers, such as EMLs, cannot be implemented in current transistor header designs.

The problems associated with various typical transistor headers are not, however, limited solely to geometric considerations and limitations. Yet other problems relate to the heat generated by components within, and external to, the transistor header. Specifically, transistor headers and their associated subcomponents may generate significant heat during operation. It is generally necessary to reliably and efficiently remove such heat to optimize performance and extend the useful life of the device.

However, transistor headers are often composed primarily of materials, Kovar® for example, that are not particularly good thermal conductors, but are instead selected for their properties of minimum thermal expansion and contraction, to match glass-metal seals and guarantee hermeticity. Such poor thermal conductivity does little to alleviate heat buildup problems in the transistor header components and may, in fact, exacerbate such problems. Various cooling techniques and devices have been employed in an effort to address this problem, but with only limited success. Such cooling problems have limited the types of lasers that may be used in transistor header applications. Particularly, such cooling problems have presented significant barriers to using lasers that are adapted for long-range fiber-optic communications such as externally modulated lasers (EMLs) that generate significant amounts of heat.

One drawback of using an EML is the heat that is generated by such a laser. Typically, most EMLs are operated between 25° C. to 30° C. As such, external cooling has commonly been required to pump heat away from the EML to maintain the laser at an appropriate operating temperature. The need for cooling components has previously imposed a limitation on the size of packages into which an EML is integrated. Further, because of the need for active cooling, the power consumption of a device integrating an EML is often greater than that allowed by many of the smaller package size standards such as XFP. Previously, EMLs have not been effectively integrated into smaller packages because of these cooling requirements. Additionally, in order to keep a laser's wavelength stable to enable such applications as DWDM, the temperature must be finely controlled to be fixed regardless of varying ambient temperatures and conditions. One of the best methods to accomplish this temperature control is to have precise control of the same cooler that is used to keep the laser at an appropriate operating temperature.

Solid state heat exchangers may be used to remove some heat from transistor header components. However, the effectiveness of such heat exchangers is typically compromised because, due to variables such as their configuration and/or physical location relative to the primary component(s) to be cooled, such heat exchangers frequently experience a passive heat load that is imposed by secondary components or transistor header structures not generally intended to be cooled by the heat exchanger. The imposition on the heat exchanger of such passive heat loads thus decreases the amount of heat the heat exchanger can effectively remove from the primary component that is desired to be cooled, thereby compromising the performance of the primary component.

As suggested above, the physical location of the heat exchanger or other cooling device has various implications with respect to the performance of the components employed present in the transistor header. One particular problem in the context of thermoelectric cooler ("TEC") type heat exchangers arises because TECs have hot and cold junctions. The cold junction, in particular, can cause condensation if the TEC is located in a sufficiently humid environment. Such condensation may materially impair the operation of components in the transistor header, and elsewhere.

Solid state coolers, such as TECs, are intrinsically very inefficient devices. State-of-the-art coolers have efficiencies measured in single or low double digits. Thus, the power consumption becomes astronomical when an attempt is made to cool lasers in packages that have significant thermal leaks. This process requires large amounts of power, which is inappropriate for small devices because it causes large temperature rises and because it is not permitted under standards, such as the XFP standard.

Another concern with respect to heat exchangers is that the dimensions of typical transistor headers are, as noted earlier, constrained by various factors. Thus, while the passive heat load placed on a heat exchanger could be at least partly offset through the use of a relatively larger heat exchanger, the diametric and other constraints imposed on transistor headers by form factor requirements and other considerations place practical limits on the maximum size of the heat exchanger.

Finally, even if a relatively large heat exchanger could be employed in an attempt to offset the effects of passive heat loads, large heat exchangers present problems in cases where the heat exchanger, such as a TEC, is used to modify the performance of transistor header components such as lasers. For example, by virtue of their relatively large thermal mass or load, such heat exchangers are not well suited to implementing the rapid changes in laser performance that are required in many applications, because such large heat exchangers cannot transfer the heat rapidly enough. Moreover, the performance of the laser or other component may be further compromised if the heat exchanger is located relatively far away from the laser because the thermal resistance is proportional to the distance between the component and the heat exchanger.

BRIEF SUMMARY OF THE INVENTION

In general, embodiments of the invention are concerned with a transistor header including various features directed to enhancing the reliability and performance of various electronic devices, such as lasers, included in the transistor header.

In one illustrative embodiment of the invention, a transistor header assembly is disclosed. The transistor header assembly includes a base through which a platform extends. The platform includes a conductive pathway that is electrically connected to an EML laser. The EML laser is mechanically secured to the platform. A cap is secured to the base so as to create an enclosed transistor header assembly.

A method of using an EML and an associated laser driving circuit is disclosed herein. The EML is operated at a temperature that is elevated from the ambient temperature. Then, by monitoring optical output from the EML, the laser driving circuit can be adjusted to maintain the optical output at a constant carrier frequency.

The invention also extends to methods for fabricating the transistor headers with EML lasers. The method includes providing a base that has a device side and a connector side. A platform is extended through both the device side and the connector side of the base. The platform includes a conductive pathway. An EML is secured to the platform on the device side of the platform. The EML is electrically connected to the conductive pathway.

According to yet another embodiment of the invention, a transistor header has a base that is divided into a device side and a connector side. A platform extends through the base. A conductive pathway is disposed on the base. The conductive pathway forms a connector on the connector side of the base. The conductive pathway further forms a mounting location on the device side of the base. The conductive pathway is arranged to form a transmission line for matching the impedance of a device that may be mounted on the component mounting location on the device side of the base to a circuit that may be connected to the connector on the connector side of the base.

The invention also extends to small form factor transceiver modules and modular or standards-based transceivers and transponders for use in fiber optic networks. The transceiver modules have a transceiver module casing. Installed in the transceiver module casing is a transmitter optical subassembly that uses an EML to generate optical signals. The transceiver also has a receiver subassembly disposed in the transceiver module casing.

These and other, aspects of embodiments of the present invention will become more fully apparent from the following description and appended claims.

BRIEF DESCRIPTION OF THE DRAWINGS

In order that the manner in which the above-recited and other advantages and features of the invention are obtained, a more particular description of the invention briefly described above will be rendered by reference to specific embodiments thereof which are illustrated in the appended drawings. Understanding that these drawings depict only typical embodiments of the invention and are not therefore to be considered limiting of its scope, the invention will be described and explained with additional specificity and detail through the use of the accompanying drawings in which.

DETAILED DESCRIPTION OF EMBODIMENTS OF THE INVENTION

Figure 1A:
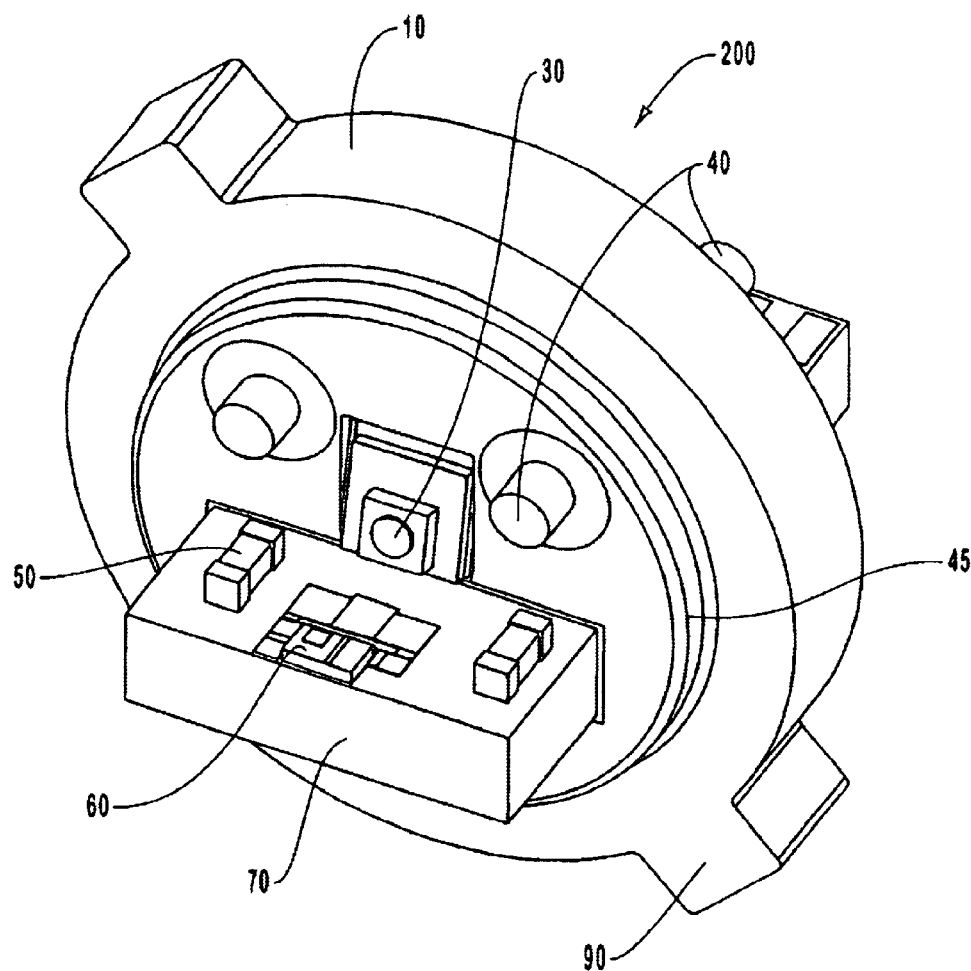
FIG. 1A is a perspective view illustrating various aspects of the device side of an exemplary embodiment of a header assembly.

Reference will now be made to figures wherein like structures will be provided with like reference designations. It is to be understood that the drawings are diagrammatic and schematic representations of various embodiments of the claimed invention, and are not to be construed as limiting the scope of the present invention in any way, nor are the drawings necessarily drawn to scale.

According to the invention, EML lasers are incorporated into a header assembly that permits the EML lasers to be used with small form factor optical transceiver modules. The components of the header assemblies, including the thermoelectric coolers, are disclosed herein. In addition, the use of EML lasers in such header assemblies is disclosed.

An EML is generally constructed from a laser, such as a distributed feedback (DFB) laser or a distributed Bragg reflector (DBR) laser and a modulator. This construction allows the EML to have a narrow line width or channel spacing. Further, the EML has low chirp or frequency drift compared to a directly mounted laser (DML). In addition, EMLs provide a relatively high extinction-ratio (ER) signal, which is easier to detect at long distances. The ER is the ratio of power in a logic "1" compared to a logic "0", and is thus a measure of contrast or detectability. EMLs are particularly useful in long-distance applications because of these characteristics. Particularly, narrow line width and low chirp allows for a high bit rate as these characteristics cause the transmitted beam to be resistant to the dispersion that causes transmission errors in adjacent transitions. For example, in a 1550 nanometer application, the dispersion in a fiber-optic fiber is high. However using an EML in a 10 Gb/s (Gigabit per second) system, and other systems transmissions of greater than 10km can be achieved. For instance, in a transceiver with an EML laser, transmissions, by way of example and not limitation, of 10 km to 160 km or 40 to 80 km can be achieved, compared with only about 10 km with a DFB DML. In a 2.5 Gb/s system, 160 km transmissions are possible, compared to only about 40 km that can be achieved using a DFB DML.

In a multiple channel system, narrow line width and low chirp allows for adjacent channels to be propagated near one another while channel crossover is minimized. A stabilized wavelength characterized by narrow line width and low chirp is important so that the fiber-optic channel can operate along a predefined ITU wavelength channel. Typically an ITU wavelength for a dense wavelength division multiplexing (DWDM) system operates such that the channel spacings are 100 GHz, 50 GHz or 25 GHz. Narrow channel spacings require precise control of the wavelength and low chirp. In addition, a high extinction ratio is important to achieve long distance transmissions. As noted above, EMLs exhibit such characteristics and are suitable for use in DWDM and long-haul systems. According to the present invention, an EML can be used in an XFP optical transceiver module, providing the benefits of both EMLs and the modularity, form factor, low power, and the other advantages of compliance with the XFP standard.

At the time of the filing of this patent application, the XFP standard is the XFP Revision 2.0 Public Draft for Comments, promulgated by the 10 Gigabit Small Form Factor Pluggable (XFP) Multi Source Agreement (MSA) Group. This XFP Revision 2.0 document is incorporated herein by reference. In addition, a newer XFP Revision 3.0 is being developed, and includes similar requirements. As used herein, the terms "XFP standard" and "XFP Multi Source Agreement" refer to the Revision 2.0 Public Draft for Comments. These terms also refer to any subsequent drafts, such as XFP Revision 3.0 or final agreements to the extent that any such subsequent drafts or final agreements are compatible with Revision 2.0.

FIGS. 1A–3B are used to describe herein details associated with a header assembly that has a feedthrough assembly for providing electrical connection within a hermetically sealed chamber. FIGS. 4A–5 are referred to herein to describe header assemblies with integrated thermoelectric coolers that can be used to dissipate heat from active components within the header assemblies, including EML lasers or other types of lasers. FIG. 5 illustrates a TOSA with an EML laser housed within a header assembly with an integrated thermoelectric cooler constructed according to the invention.

1. Header Assemblies

Figure 1B:
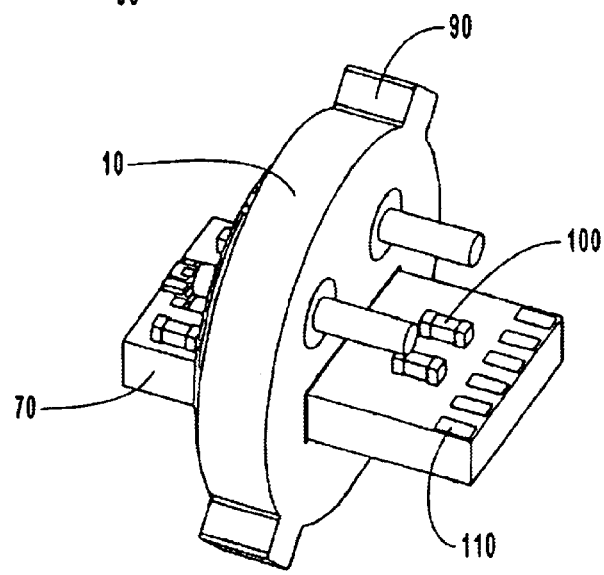
FIG. 1B is a perspective view illustrating various aspects of the connector side of an exemplary embodiment of a header assembly.

Reference is first made to FIGS. 1A and 1B together, which illustrate perspective views of one presently preferred embodiment of a header assembly, designated generally at 200. In the illustrated example, the header assembly 200 includes a substantially cylindrical metallic base 10. The base 10 includes two flanges 90 for releasably securing the header 200 to a receptacle (not shown) on a higher level opto-mechanical assembly. The base can be formed of Alloy 42, which is an iron nickel alloy, as well as cold-rolled steel, Vacon VCF-25 Alloy, or Kovar. The base 10 also includes a ceramic platform 70 extending perpendicularly through the base as shown. The ceramic platform is hermetically sealed to the base to provide mechanical and environmental protection for the components contained in the TO package. Ceramic materials may include alumina ($Al_2O_3$) or aluminum nitride (AlN).

The hermetic seal between the base 10 and the platform 70 is created by electrically insulating glass-to-metal seals. Alternatively, the platform 70 may incorporate two additional ceramic outer layers to electrically isolate the outermost conductors. In this second case, a metal braze or solder can be used to hermetically seal the platform 70 to the metal base. This solution overcomes the principal shortcomings of glasses, namely their low strength, brittleness, and low thermal conductivity.

The platform 70 is structured to house multiple electrical components 50 and 100, and active devices 60 on either side of the base. In the illustrated embodiment, the active device 60 comprises a semiconductor laser, and the components 50 and 100 may include resistors, capacitors, and inductors that are used to balance the driving impedance of the laser with the component impedance. As discussed in more detail below, impedance matching circuits may also be created by etching electrical traces that have various capacitive, inductive or resistive properties, on platform 70. In addition to matching, components may have peripheral functions such as measuring temperature, sensing laser optical power or wavelength, etc. As it is important for a semiconductor laser to be precisely positioned perpendicularly to the base 10, platform 70 is, therefore, precisely positioned perpendicularly with respect to the base 10.

Where active device 60 comprises a semiconductor laser, a small deviation in the position of active device 60, in relation to base 10 can cause a large deviation in the direction of the emitted laser beam. Accurate perpendicularity between the platform and the base can be achieved by incorporating a vertical pedestal feature in the base material, as shown on FIG. 1A. The vertical pedestal houses the photodiode 30 in the embodiment shown in FIG. 1A. Such feature can be machined, stamped, or metal injection molded directly with the base thus providing a stable and geometrically accurate surface for mating with the platform.

The platform 70 further includes multiple electrically isolated conductive pathways 110 extending throughout the platform 70 and consequently through the base 10. The conductive pathways 110 provide the electrical connections necessary between electrical devices or components located throughout the platform 70. The conductive pathways 110 form a connector on that side of the base that does not include the semiconductor laser 60, also referred to herein as the "connector side" of the base. Note in connection with the foregoing that the side of the base where the active device 60 is located may in some instances be referred to herein as the "device side" of the base.

The connector formed by the conductive pathways 110 is used to electrically connect the header assembly 200 to a second electrical subassembly, such as a printed circuit board, either directly (for example, by solder connection) or indirectly by an intermediary device such as a flexible printed circuit. The semiconductor laser 60 is electrically connected to the electrical components 50 and 100 via the conductive pathways 110.

The platform 70 may also comprise multiple layers wherein each layer may have a conductive layer with various conductive pathways 110. In this way numerous conductive pathways 110 may be constructed for use with various components disposed on the platform 70. Generally, the layers are electrically isolated from one another, however various conductive pathways 110 on different layers may be connected by a via such as is commonly known in printed circuit board arts.

Further, the conductive pathways 110 can be shaped and placed such that they have controlled capacitive, inductive, or resistive effects to create waveguides such as a microstrip or stripline (cpw, etc.). For example, knowing certain characteristics about the materials used in making the conductive pathways 110 and the materials of the various layers of the platform 70, passive electrical devices can be constructed by appropriately configuring the conductive pathways 110. In this way, a transmission line with known characteristics can be created for use with active devices 60 attached to the platform 70. As noted above, by matching the characteristics of the transmission line connected to active devices 60 with the active devices' 60 load impedance, electrical reflections that cause transmission errors and lower power output can be reduced or in many cases eliminated.

By constructing a transmission line that matches active device 60 impedance on the platform 70 from the conductive traces 110, the need to add additional discrete matching components is eliminated often resulting in better overall circuit performance. In fact, previously due to the lack of adequate matching circuits, applications involving transistor headers have been limited to 10 Gb/s. With the improvements of using a transmission line constructed on the platform 70, applications up to 40 Gb/s or more can be implemented.

While the preceding description has discussed active devices 60 in terms of lasers, it should be noted that the transmission lines may also be formed such that a matching circuit for other semiconductor devices is constructed. For example, the transmission lines may be used to connect directly to a laser, such as in the case of DFB lasers. Alternately, the transmission lines may be used to connect to an EA modulator, for example, such as in the case of EMLs that incorporate a DFB laser and an EA modulator. As discussed herein, the impedance values of the impedance matching transmission lines depend on the load impedance of the active devices attached to the platform 70.

External components, while still useful, are not ideal for impedance matching because they often represent an additional load that must be driven by the power supply driving the electronic component, such as when resistors are used to match the active device load impedance. Additionally, although the external components may be placed reasonably close to the active devices 60, there is always some small distance between the external components and the active devices 60 that acts as an unmatched transmission line.

The use of advanced ceramic materials, examples of which include aluminum nitride and beryllia, allows the header assembly 200 to achieve substantially lower thermal resistances between the devices inside the package and the outside world where heat is ultimately transferred. As discussed in further detail below in the context of an alternative embodiment of the invention, a cooling device, such as a thermoelectric cooler ("TEC"), a heat pipe or a metal heat spreader, can be mounted directly on the platform, thereby providing for a very short thermal path between the temperature sensitive devices on the platform and a heat sink located outside the header assembly.

As is further shown in FIGS. 1A and 1B, the header assembly 200 additionally includes two conductive leads 40 extending through and out both sides of the base 10. The conductive leads 40 are hermetically sealed to the base 10 to provide mechanical and environmental protection for the components contained in the TO package between the conductive leads 40 and the base 10. The hermetic seal between the conductive leads 40 and the base 10 is created, for example, by glass or other comparable hermetic insulating materials that are known in the art. The conductive leads 40 can also be used to electrically connect devices and/or components located on opposite sides of the base.

In the illustrated embodiment at least, the conductive leads 40 extend out from the side of the base 10 that does not contain the semiconductor laser 60, in a manner that allows for the electrical connection of the header assembly 200 with a specific header receptacle located on, for example, a printed circuit board. It is important to note that conductive pathways 110 and conductive leads 40 perform the same function and that the number of potential conductive pathways 110 is far greater than the potential number of conductive leads 40. Alternative embodiments can incorporate even more conductive pathways 110 than shown in the illustrated embodiment.

The platform 70 further includes steps and recessed areas that permit mounting devices with various thicknesses flush with the metal pads on the ceramic. This allows the use of the shortest electrical interconnects, wire bonds for example, having improved electrical performance and characteristics. This also provides optical benefits by, for example, aligning the active region of a laser mounted on the platform with the optical axis of the package.

The photodiode 30 is used to detect the signal strength of the semiconductor laser 60 and relay this information back to control circuitry of the semiconductor laser 60. In the illustrated embodiment, the photodiode can be directly connected to the conductive leads 40. Alternatively, the photodiode can be mounted directly onto the same platform as the laser, in a recessed position with respect to the light emitting area. This recessed position allows the photodiode to capture a fraction of the light emitted by the laser, thus allowing the photodiode to perform the same monitoring function.

This configuration of the monitoring photodiode allows for eliminating the need of conductive leads 40, and lends itself to simplified electrical connections, such as wire bonds, to the conductive pathways 110 of the platform 70. In an alternative embodiment, the photodiode light gathering can be increased by positioning an optical element on the base for focusing or redirecting light, such as a mirror, or by directly shaping and/or coating the base metal to focus additional light onto the photodiode.

As is further shown in FIG. 1A, the base 10 includes a protruding portion 45 that is configured to releasably position or locate a cap (not shown) over one side of the base 10. A cap can be placed over the side of the base 10 containing the semiconductor laser 60 for the purpose of protecting the semiconductor laser 60 from potentially destructive particles. A transparent cap is preferable for the illustrated embodiment so as to allow the laser light to escape the region between the cap and the base 10.

Figure 2A:
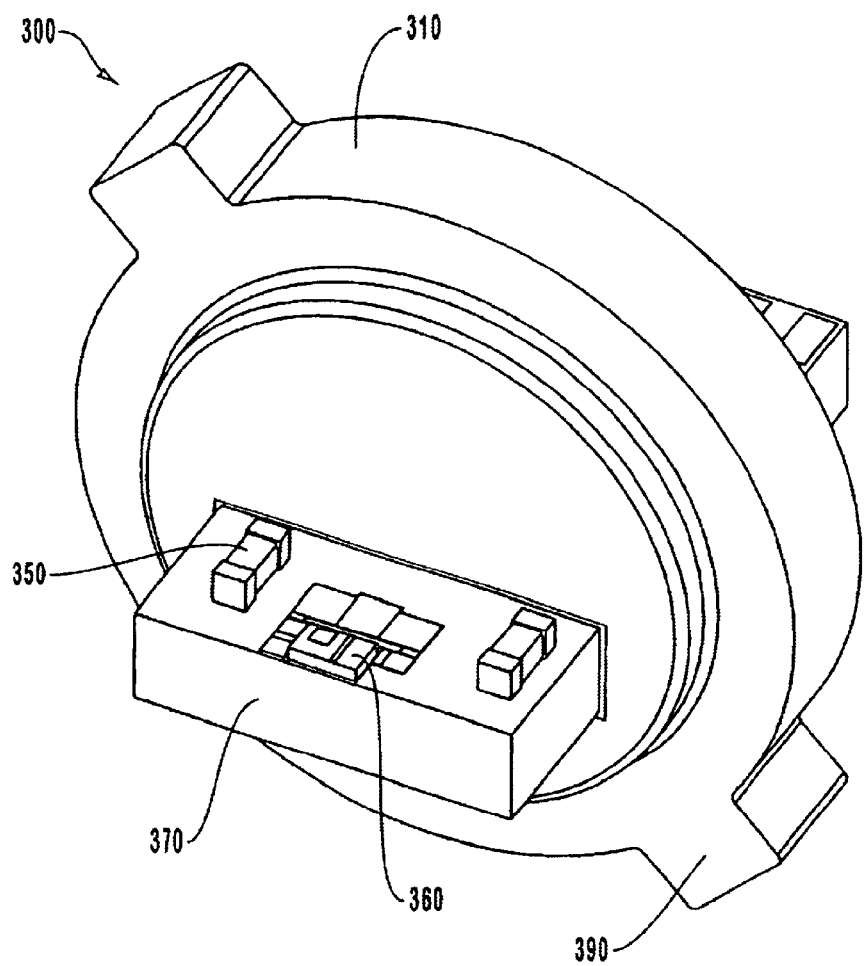
FIG. 2A is a perspective view illustrating various aspects of the device side of an alternative embodiment of a header assembly.
Figure 2B:
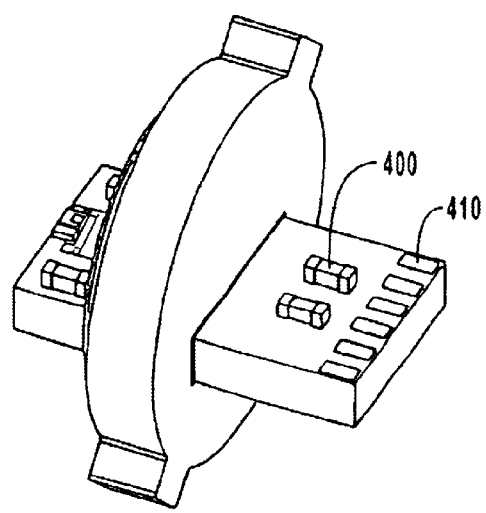
FIG. 2B is a perspective view illustrating various aspects of the connector side of an alternative embodiment of a header assembly.

Reference is next made to FIGS. 2A and 2B, which illustrate perspective views of an alternative embodiment of a header assembly, designated generally at 300. This alternative embodiment shows an optical receiver 360 mounted horizontally on the platform 370 perpendicularly bisecting the base 310 of the header assembly 300. The optical receiver can be a photodetector or any other device capable of receiving optical signals. The optical receiver 360 is mounted flat on the platform 370 and detects light signals through the side facing away from the base 310. This type of optical receiver is sometimes referred to as an "edge detecting" detector. The base 310 and platform 370 are described in more detail with reference to FIGS. 1A and 1B. The platform 370 contains electrical components 350, 400 on either side of the base for operating the optical receiver 360. The platform 370 also includes conductive pathways 410 for electrically connecting devices or components on either side of the base 310. This embodiment of a header assembly does not contain conductive leads and therefore all electrical connections are made via the conductive pathways 410.

Figure 3A:
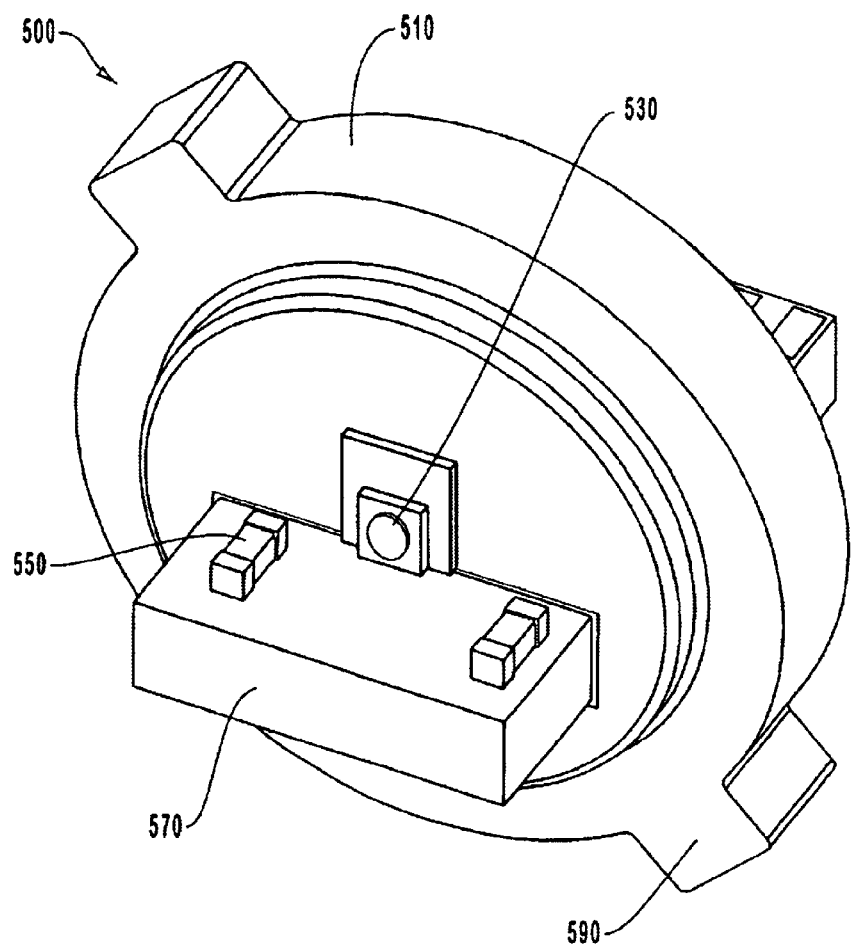
FIG. 3A is a perspective view illustrating various aspects of the device side of another alternative embodiment of a header assembly.
Figure 3B:
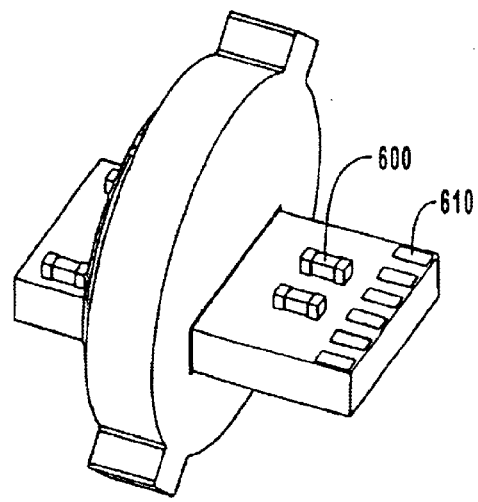
FIG. 3B is a perspective view illustrating various aspects of the connector side of another alternative embodiment of a header assembly.
Figure 4A:
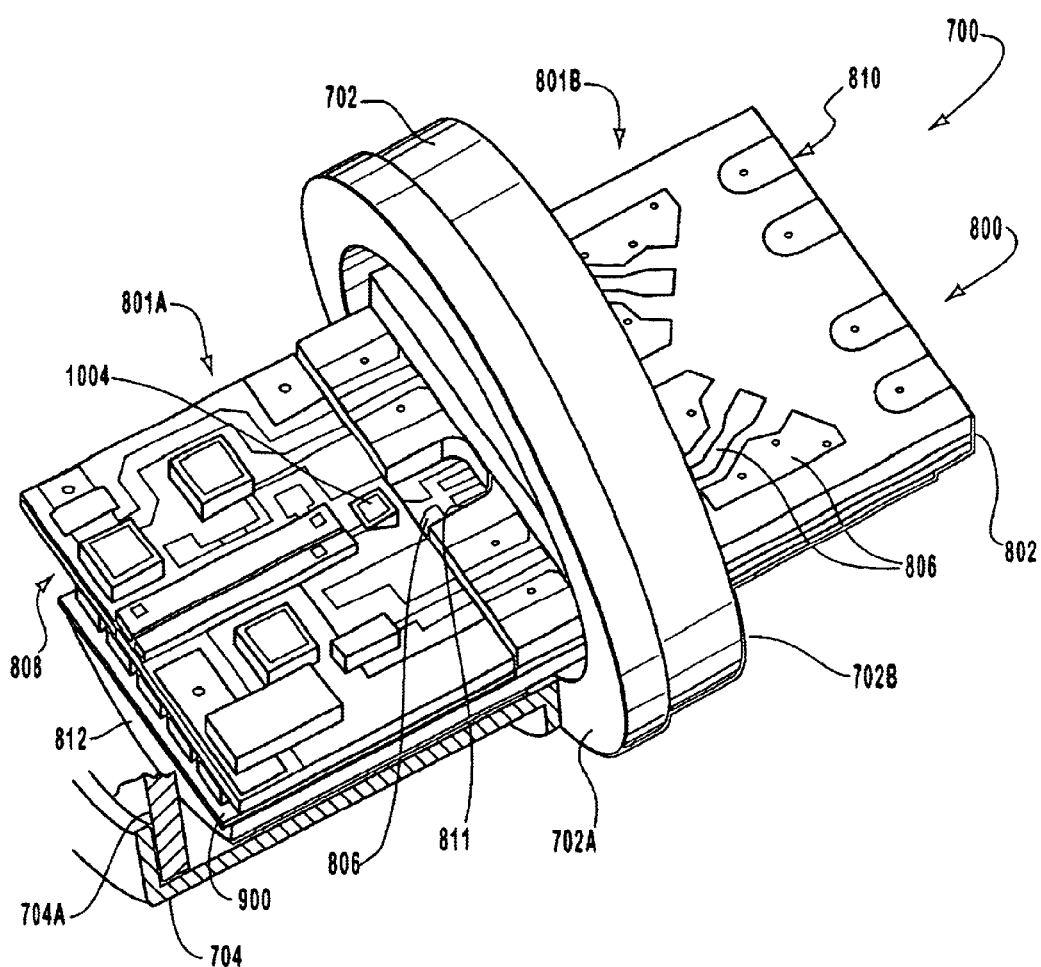
FIG. 4A is a top perspective view of an exemplary embodiment of a header including active devices mounted on a TEC disposed within a hermetic chamber.

Reference is next made to FIGS. 3A and 3B, which illustrate perspective views of yet another alternative embodiment of a header assembly, designated generally at 500. This alternative embodiment also shows an optical receiver 530 mounted vertically on the base 510. The optical receiver can be a photodetector or any other device capable of receiving optical signals. This is an optical receiver 530 which detects light signals from the top of the device. The base 510 and platform 570 are described in more detail with reference to FIGS. 1A and 1B. The platform 570 contains electrical components 550, 600 on either side of the base for operating the optical receiver 530. The platform 570 also includes conductive pathways 510 for electrically connecting devices or components on either side of the base 510. This embodiment of a header assembly does not contain conductive leads and therefore all electrical connections are made via the conductive pathways 410.

In other embodiments of the invention, the optical receiver 360 or optical receiver 530 is an avalanche photodiode (APD). Generally, APDs represent a good choice for an optical receiver because they have good noise and gain characteristics. Specifically, the wide gain bandwidth product of APDs allows for more versatility in design such that noise can be reduced and transmission distances increased. Unlike the transmitter designs disclosed herein, these receivers often include active semiconductor integrated circuits mounted next to the receiver pin diode or APD, generally in the form of a transimpedance amplifier (TIA) or a TIA with a limiting amplifier (TIALA).

2. Thermoelectric Coolers Used with Header Assemblies

Directing attention now to FIGS. 4A through 4D, various aspects of an alternative embodiment of a header assembly, generally designated at 700, are illustrated. The embodiment of the header assembly illustrated in FIGS. 4A through 4D is similar in many regards to one or more of the embodiments of the header assembly illustrated in FIGS. 1A through 3B. Accordingly, the discussions of FIGS. 4A through 4D will focus primarily on certain selected aspects of the header assembly 700 illustrated there. Note that in one embodiment of the invention, header assembly 700 comprises a transistor header. However, header assembly 700 is not limited solely to that exemplary embodiment.

As indicated in FIGS. 4A through 4D, header assembly 700 generally includes a base 702 through which a platform 800 passes. The platform 800 is configured to receive a cooling device 900 upon which various devices and circuitry are mounted. Note that while it may be referred to herein as a "cooling" device 900, the cooling device 900 may, depending upon its type and the application where it is employed, serves both to heat and/or cool various components and devices. Finally, a cap 704 mounted to, and cooperating with, base 702, serves to define a hermetic chamber 706 which encloses cooling device 900 and the mounted devices and circuitry.

As discussed in further detail below, a variety of means may be employed to perform the functions disclosed herein, of a cooling device. Thus, the embodiments of the cooling device disclosed and discussed herein are but exemplary structures that function as a means for transferring heat. Accordingly, it should be understood that such structural configurations are presented herein solely by way of example and should not be construed as limiting the scope of the present invention in any way. Rather, any other structure or combination of structures effective in implementing the functionality disclosed herein may likewise be employed.

Figure 4B:
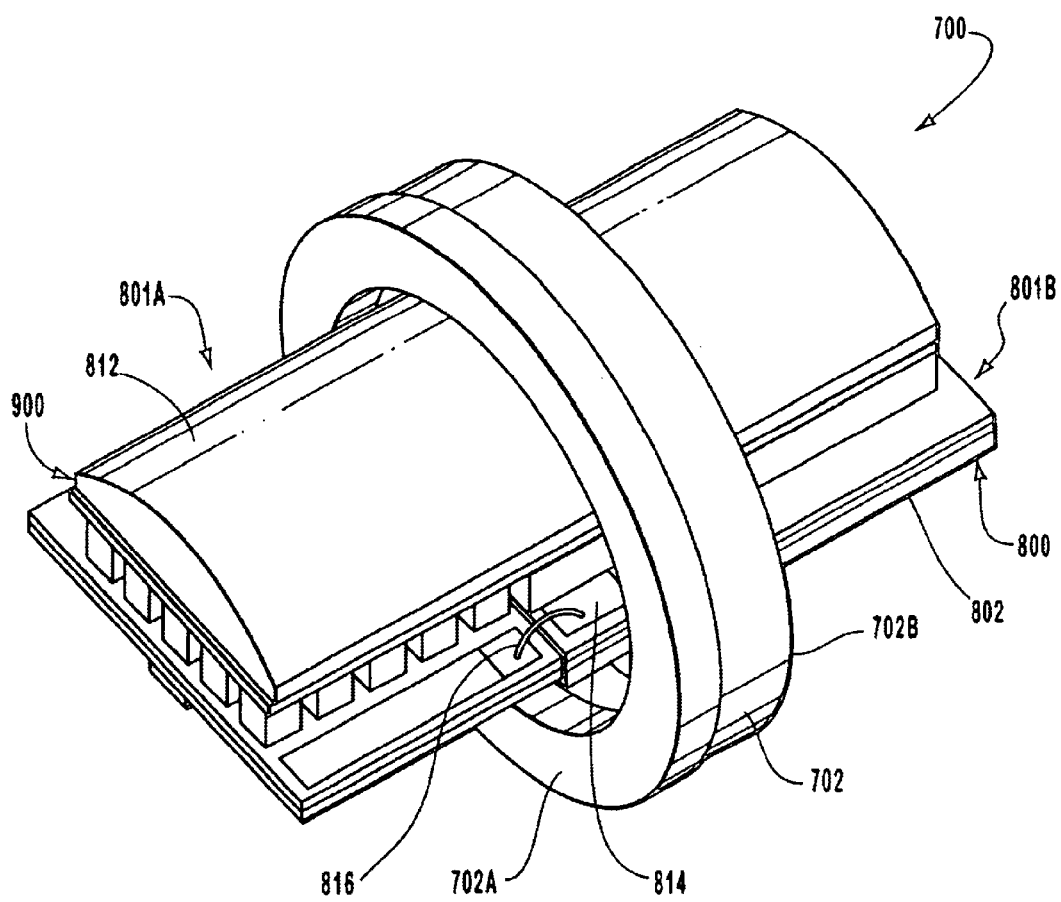
FIG. 4B is a bottom perspective view of the exemplary embodiment illustrated in FIG. 4A.
Figure 4C:
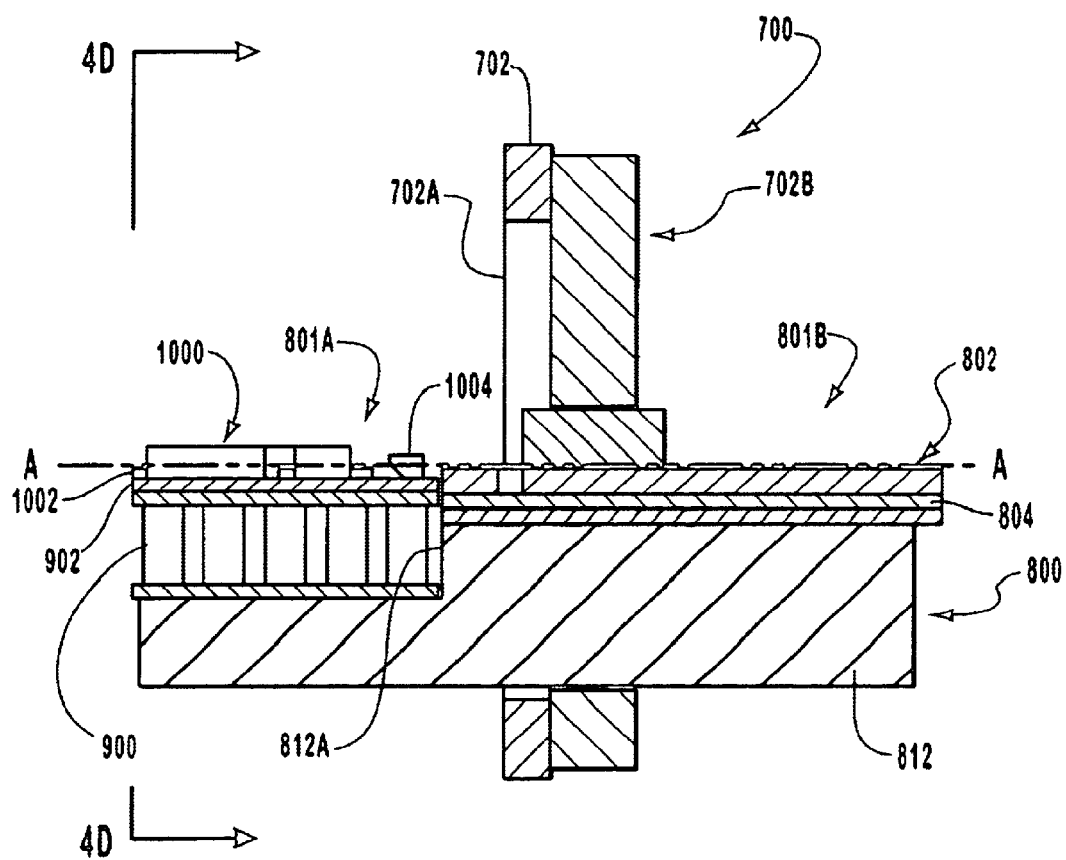
FIG. 4C is a cross-section view illustrating various aspects of the exemplary embodiment presented in FIGS. 4A and 4B.
Figure 4D:
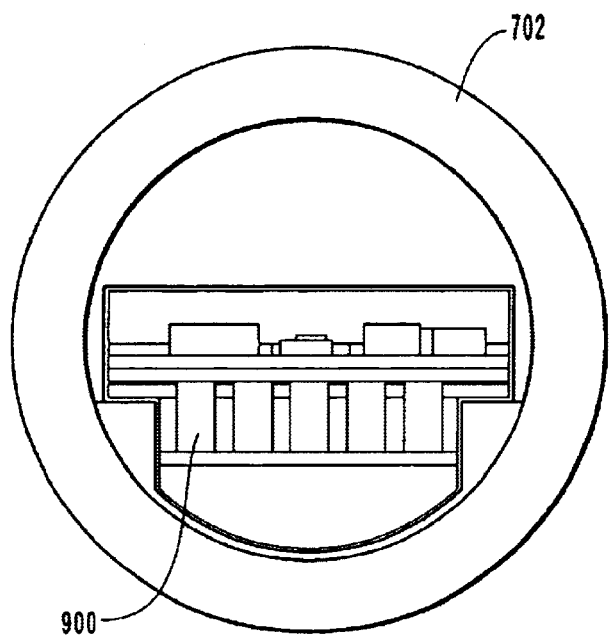
FIG. 4D is a cross-section view taken along line 4D—4D of FIG. 4C and illustrates various aspects of an exemplary arrangement of a TEC in a header assembly.
Figure 5:
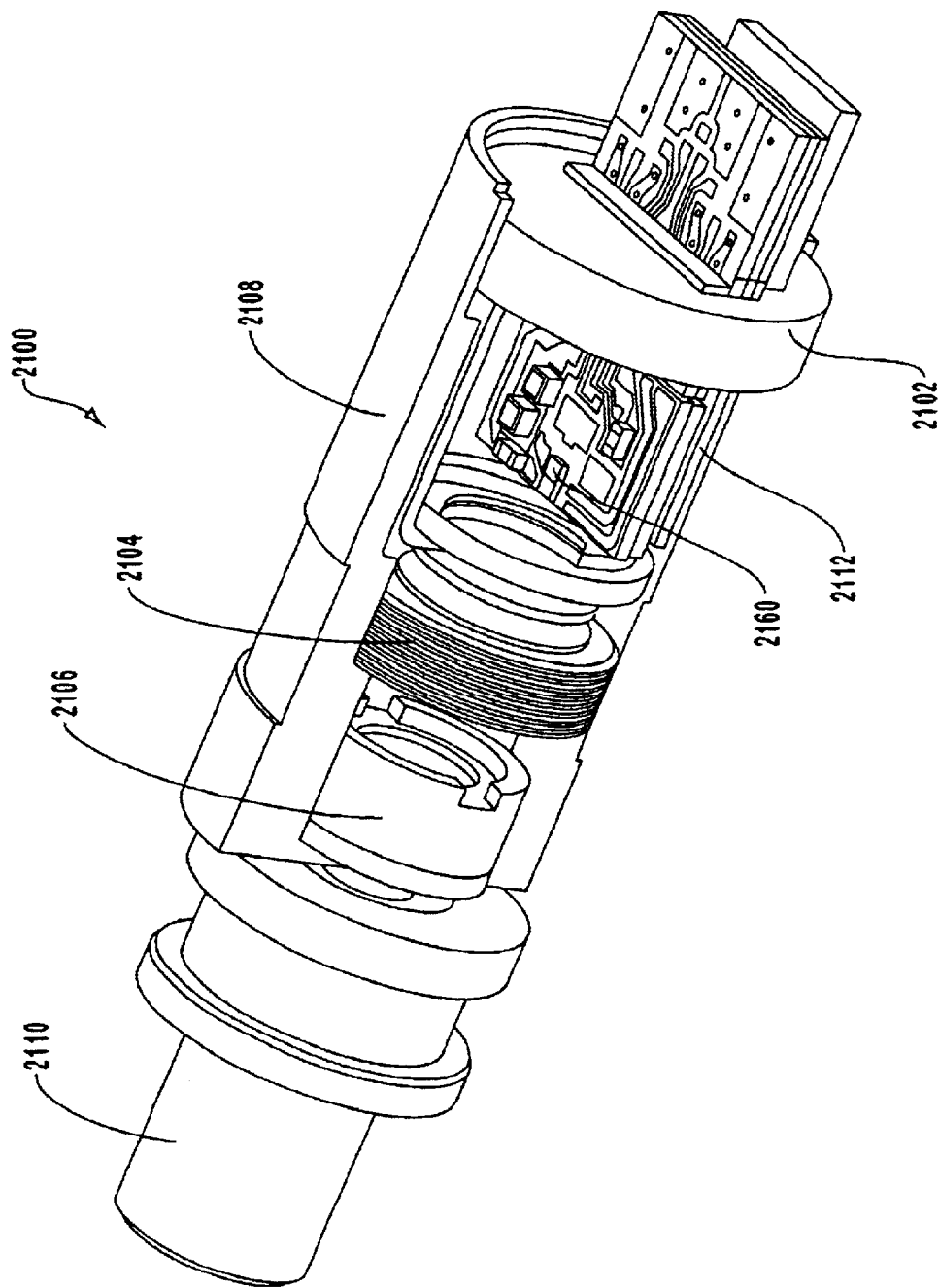
FIG. 5 is a perspective view of an exemplary transmitter optical subassembly with a transistor header assembly and an EML as well as optics, such as a lens, isolator, and a receptacle for an optical cable such as an LC cable.

With continuing attention to FIGS. 4A and 4B, and directing attention also to FIGS. 4C and 4D, further details are provided concerning various aspects of platform 800. In the illustrated embodiment, platform 800 is disposed substantially perpendicularly with respect to base 702. In particular, base 702 includes a device side 702A and a connector side 702B, and platform 800 passes completely through base 702, so that an inside portion of platform 800 is disposed on device side 702A of base 700 and outside portion 801B of platform 800 is disposed on connector side 702B of base 702. However, this arrangement of platform 800 is exemplary only, and various other arrangements of platform 800 may alternatively be employed consistent with the requirements of a particular application.

In the illustrated embodiment, platform 800 includes a first feedthrough 802 having a multi-layer construction that includes one or more layers 804 of conductive pathways 806 (see FIG. 4A). In general, conductive pathways 806 permit electrical communication among the various components and devices (removed for clarity) disposed on platform 800, while also permitting such components and devices to electrically communicate with other components and devices that are not a part of platform 800. Moreover, conductive pathways 806 cooperate to form a connector 810 situated on the outside portion 801B of platform 800, on the connector side 702B of base 700. In general, connector 810 facilitates electrical communication between header assembly 700 and other components and devices such as, but not limited to, printed circuit boards (see FIG. 4E). In one embodiment, connector 810 comprises an edge connector, but any other form of connector may alternatively be used, consistent with the requirements of a particular application. As discussed in further detail below, first feedthrough 802 may include cutouts 811 or other geometric features which permit direct access to, and electrical connection with, one or more conductive pathways 806 disposed on an inner layer of first feedthrough 802.

In addition to the first feedthrough 802, platform 800 further includes a second feedthrough 812 to which the first feedthrough 802 is attached. Note that in the exemplary illustrated embodiment, first feedthrough 810, with the exception of conductive pathways 806, often is formed from a ceramic material that is generally resistant to heat conduction. However, other ceramic materials, such as AlN, are conductive of heat and can be used to assist in the transfer of heat out of the package. Second feedthrough 812 in the illustrated embodiment comprises a material that is generally useful as a heat conductor, such as a metal. Copper and copper alloys, such as CuW, are examples of metals that are suitable in some applications. Thus, platform 800 is generally configured to combine heat conductive elements with non-heat conductive elements so as to produce a desired effect or result concerning the device wherein platform 800 is employed.

In connection with the foregoing, it should be noted further that ceramics and metals are exemplary materials only and any other material or combination thereof that will facilitate implementation of the functionality disclosed herein may alternatively be employed. Moreover, other embodiments of the invention may employ different arrangements and numbers of, for example, conductive and non-conductive feedthroughs, or feedthroughs having other desirable characteristics. Accordingly, the illustrated embodiments are exemplary only and should not be construed to limit the scope of the invention in any way.

With respect to their configurations, the geometry of both first feedthrough 802 and second feedthrough 812 may generally be configured as necessary to suit the requirements of a particular application or device. In the exemplary embodiment illustrated in FIGS. 4A through 4D, second feedthrough 812 incorporates a step 812A feature which serves to, among other things, provide support for cooling device 900 and, as discussed in further detail below, to ensure that devices mounted to cooling device 900 are situated at a desirable location and orientation. As further indicated in FIG. 4D, for example, second feedthrough 812 defines a semi-cylindrical bottom that generally conforms to the shape of cap 704 and contributes to the stability of cooling device 900, as well as providing a relatively large conductive mass that aids in heat conduction to and/or from, as applicable, cooling device 900 and other devices.

As suggested earlier, platform 800 also serves to provide support to cooling device 900. Directing renewed attention now to FIGS. 4A through 4D, details are provided concerning various aspects of cooling device 900. In particular, a cooling device 900 is provided that is mounted is directly to platform 800. In an exemplary embodiment, cooling device 900 comprises a thermoelectric cooler ("TEC") that relies for its operation and usefulness on the Peltier effect wherein electrical power supplied to the TEC may, according to the requirements of a particular application, cause selected portions of the TEC to generate heat and/or provide a cooling effect. Exemplary construction materials for the TEC may include, but are not limited to, bismuth telluride (Bi$_2$Te$_3$), and other such materials designed to maximize the thermoelectric effect. These materials are selected to have minimum thermal conductivity, since it is directly parasitic to the cooling/heating effect (one side gets cold, the other hot, and the device itself is a direct short). The platform 800 is highly thermally conductive, and can be formed from Cu or CuW.

Note that the TEC represents an exemplary configuration only, and various other types of cooling devices may alternatively be employed as required to suit the dictates of a particular application. By way of example, where active temperature control of one or more electronic devices 1000, aspects of which are discussed in more detail below, is not required, the TEC may be replaced with a thermally conductive spacer, laser control circuitry, laser power supply circuitry or other similar devices. Furthermore, a combination of devices may be placed into transistor header in the location showing the TEC in FIGS. 4*a*–4*d*.

In addition to providing heating and/or cooling functionality, cooling device 900 also includes a submount 902 that supports various electronic devices 1000 such as, but not limited to, resistors, capacitors, and inductors, as well as optical devices such as mirrors, lasers, and optical receivers. Thus, cooling device 900 is directly thermally coupled to electronic devices 1000.

In one exemplary embodiment, the electronic devices 1000 include a laser 1002, such as a semiconductor laser, or other optical signal source. With regard to devices such as laser 1002, at least, cooling device 900 is positioned and configured to ensure that laser 1002 is maintained in a desired position and orientation. By way of example, in some embodiments of the invention, cooling device 900 is positioned so that an emitting surface of laser 1002 is positioned at, and aligned with, a longitudinal axis A—A of header assembly 700 (FIG. 4C).

Note that although reference is made herein to the use of a laser 1002 in conjunction with cooling device 900, it should be understood that embodiments employing laser 1002 are exemplary only and that additional or alternative devices may likewise be employed. Accordingly, the scope of the invention should not be construed to be limited solely to lasers and laser applications.

In at least some of those embodiments where a laser 1002 is employed, a photodiode 1004 and thermistor 1006 are also mounted on, or proximate to, submount 902 of cooling device 900. In general, photodiode 1004 is optically coupled with laser 1002 such that photodiode 1004 receives at least a portion of the light emitted by laser 1002, and thereby aids in gathering light intensity data concerning laser 1002 emissions. Further, thermistor 1006 is thermally coupled with laser 1002, thus permitting the gathering of data concerning the temperature of laser 1002. There may also be a wavelength locking circuit having two separate photodiodes with different wavelength-sensitive responses, which is known as a wavelocker.

In some embodiments, photodiode 1004 comprises a 45 degree monitor photodiode. The use of this type of diode permits the related components, such as laser 1002 and thermistor 1006 for example, to be mounted and wirebonded on the same surface. Typically, the 45 degree monitor diode is arranged so that light emitted from the back of laser 1002 is refracted on an inclined surface of the monitor diode and captured on a top sensitive surface of the monitor diode. In this way, the monitor diode is able to sense the intensity of the optical signal emitted by the laser.

Note that in those embodiments where a laser 1002 is employed, cap 704 includes an optically transparent portion, or window, 704A through which light signals generated by the laser 1002 are emitted. Similarly, in the event electronic device 1000 comprises other optical devices, such as an optical receiver, cap 704 would likewise include a window 704A so as to permit reception, by the optical receiver, of light signals. As suggested by the foregoing, the construction and configuration of cap 704 may generally be selected as required to suit the parameters of a particular application.

In view of the foregoing general discussion concerning various electronic devices 1000 that may be employed in conjunction with cooling device 900, further attention is directed now to certain aspects of the relation between such electronic devices 1000 and cooling device 900. In general, cooling device 900 may be employed to remove heat from, or add heat to, one or more of the electronic devices 1000, such as laser 1002, to achieve a desired effect. As discussed in further detail herein, the capability to add and remove heat, as necessary, from a device such as laser 1002, may be employed to control the performance of laser 1002, such as wavelength stability for DWDM applications In an exemplary embodiment, the heating and cooling, as applicable, of electronic devices 1000 is achieved with a cooling device 900 that comprises a TEC. Various aspects of the arrangement and disposition of electronic devices 1000, as well as cooling device 900, serve to enhance these ends. By way of example, because electronic devices 1000 are mounted directly to cooling device 900 results in a relatively short thermal path between electronic devices 1000 and cooling device 900. Generally, such a relatively shorter thermal path between components translates to a corresponding increase in the efficiency with which heat may be transferred between those components. Such a result is particularly useful where devices whose operation and performance is highly sensitive to heat and temperature changes, such as lasers, are concerned. Moreover, a relatively short thermal path also permits the transfer of heat to be implemented relatively more quickly than would otherwise be the case. Because heat transfer is implemented relatively quickly, this exemplary arrangement can be used to effectively and reliably maintain the temperature of laser 1002 or other devices.

Another aspect of at least some embodiments relates to the location of cooling device 900 relative, not just to electronic devices 1000, but to other components, devices, and structures of header assembly 700. In particular, because cooling device 900 is located so that the potential for heat transmission, whether radiative, conductive, or convective, from other components, devices, and structures of header assembly 700 to cooling device 900 is relatively limited, the passive heat load imposed on cooling device 900 by such other components and structures is relatively small. Note that, as contemplated herein, the "passive" heat load generally refers to heat transferred to cooling device 900 by structures and devices other than those upon which cooling device 900 is primarily intended to exert a heating and/or cooling effect. Thus, in this exemplary embodiment, "passive" heat loads refers to all heat loads imposed on cooling device 900 except for those heat loads imposed by electronic devices 1000.

The relative reduction in heat load experienced by cooling device 900 as a consequence of its location has a variety of implications. For example, the reduced heat load means that a relatively smaller cooling device 900 may be employed than would otherwise be the case. This is a desirable result, particularly in applications such as header assemblies where space may be limited. As another example, a relatively smaller cooling device 900, at least where cooling device 900 comprises a TEC, translates to a relative decrease in the amount of power required to operate cooling device 900. This effect is quite significant, since TECs are very inefficient. The power to effectively cool is much more than the load, so any reduction in load has a multiplicative benefit. Another consideration relating to the location of cooling device 900 concerns the performance of laser 1002 and the other electronic components 1000 disposed in hermetic chamber 706. In particular, the placement of cooling devices 900, such as TECs that include a "cold" connection, in hermetic chamber 706 substantially forecloses the occurrence of condensation, and the resulting damage to other components and devices of header assembly 700, caused by the cold connection, that might otherwise result if cooling device 900 were located outside hermetic chamber 706.

In addition to the heat transfer effects that may be achieved by way of the location of cooling device 900, and the relatively short thermal path that is defined between cooling device 900 and the electronic devices 1000 mounted to submount 902 of cooling device 900, yet other heat transfer effects may be realized by way of various modifications to the geometry of cooling device 900. In connection with the foregoing, it is generally the case that by increasing the size of cooling device 900, a relative increase in the capacity of cooling device 900 to process heat will be realized.

In this regard, it should be noted that it is the case in many applications that the diameter of base 702 is often constrained to fit within certain predetermined form factors or dimensional requirements and that such form factors and dimensional requirements, accordingly, have certain implications with respect to the geometric and dimensional configuration of cooling device 900.

By way of example, the diametric requirements placed on base 702 may serve to limit the overall height and width of cooling device 900 (see, e.g., FIG. 4D). In contrast however, the overall length of header assembly 700 is generally not so rigidly constrained. Accordingly, certain aspects of cooling device 900, such as its length for example, may desirably be adjusted to suit the requirements of a particular application. In the case of a TEC, for example, such a dimensional increase translates into a relative increase in the amount of heat that cooling device 900 can process. As noted earlier, such heat processing may include transmitting heat to, and/or removing heat from, one or more of the electronic components 1000, such as laser 1002.

Moreover, various dimensions and geometric aspects of cooling device 900 may be varied to achieve other thermal effects as well. By way of example, in the event cooling device 900 comprises a TEC, a relatively smaller cooling device 900 with a correspondingly low load and thermal mass will permit relatively quicker changes in the temperature of electronic devices 1000 mounted thereto. The low thermal mass of the load of the TEC enables rapid thermal servoing and thus high-bandwidth temperature control. In the case where electronic device 1000 comprises a laser, this capability is particularly desirable as it lends itself to control of laser performance through the vehicle of temperature adjustments.

Turning now to consideration of the power requirements for cooling device 900, at least where it comprises a TEC, and electronic devices 1000, it was suggested earlier herein that those devices typically rely for their operation on a supply of electrical power. Generally, the TEC must be electrically connected with platform 800 so that power for the operation of the TEC, transmitted from a power source (not shown) to platform 800, can be directed to the TEC. Additionally, power is supplied to electronic devices 1000 by way of platform 800, and electronic devices 1000 must, accordingly, be connected with one or more of the conductive pathways 806 of platform 800.

Figure 4E:
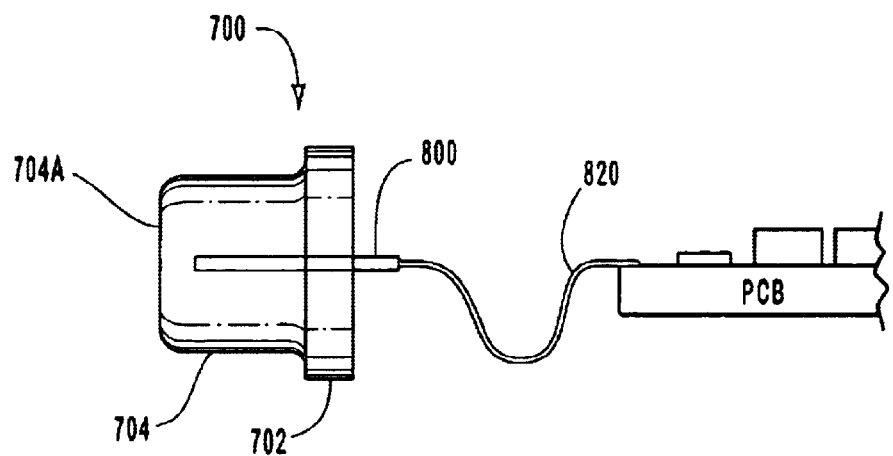
FIG. 4E is a side view illustrating aspects of an exemplary electrical connection scheme for the header assembly and a printed circuit board.

The foregoing electrical connections and configurations may be implemented in a variety of ways. Various aspects of exemplary connection schemes are illustrated in FIGS. 4A, 4B and 4E. With reference first to FIG. 4B, the underside of submount 902 of cooling device 900 is connected with conductive elements 814 disposed on the underside of first feedthrough 802, by way of connectors 816 such as, but not limited to, wire bonds. Such conductive elements 814 may be electrically connected with selected conductive pathways 806 (see FIG. 4A) and/or connector 810, that are ultimately connected with an electrical power source (not shown).

Directing attention next to FIG. 4A, details are provided concerning various aspects of the electrical connection of electronic devices 1000 disposed on submount 902. As noted earlier, and illustrated in FIG. 4A, some embodiments of platform 800 include one or more cutouts 811, or other geometric feature that, that permits direct connection of electronic devices 1000, such as laser 1002 to one or more conductive pathways 806 disposed within first feedthrough 802 of platform 800. This connection may be implemented by way of connectors 816, such as bond wires, or other appropriate structures or devices. In addition to the aforementioned connection, and as illustrated in FIG. 4E, at least some embodiments of the invention further include a flex circuit 820, or similar device, which serves to electrically interconnect platform 800 of header assembly 700 with another device, such as a printed circuit board.

With attention now to FIGS. 4A through 4D, details are provided concerning various operational aspects of header assembly 700. In general, power is provided to laser 1002 and/or other electrical components 1000 by way of connector 810, conductive pathways 806, and connectors 818. In response, laser 1002 emits an optical signal. Heat generated as a result of the operation of laser 1002, and/or other electronic components 1000, is continuously removed by cooling device 900, which comprises a TEC in at least those cases where a laser 1002 is employed in header assembly 700, and transferred to second feedthrough 812 upon which cooling device 900 is mounted. Ultimately, second feedthrough 812 transfers heat received from cooling device 900 out of header assembly 700.

Because cooling device 900 is disposed within hermetic chamber 706, the cold junction on cooling device 900, where it comprises a TEC, does not produce any undesirable condensation that could harm other components or devices of header assembly 700. Moreover, the substantial elimination of passive heat loads on cooling device 900, coupled with the definition of a relatively short thermal path between electronic components 1000, such as laser 1002, and cooling device 900, further enhances the efficiency with which heat can be removed from such electronic components and, accordingly, permits the use of relatively smaller cooling devices 900. And, as discussed earlier, the relatively small size of cooling device 900 translates to a relative decrease in the power required to operate cooling device 900. Yet other operational aspects of embodiments of the invention are considered in further detail below in the context of the discussion of a laser control system.

Figure 4F:
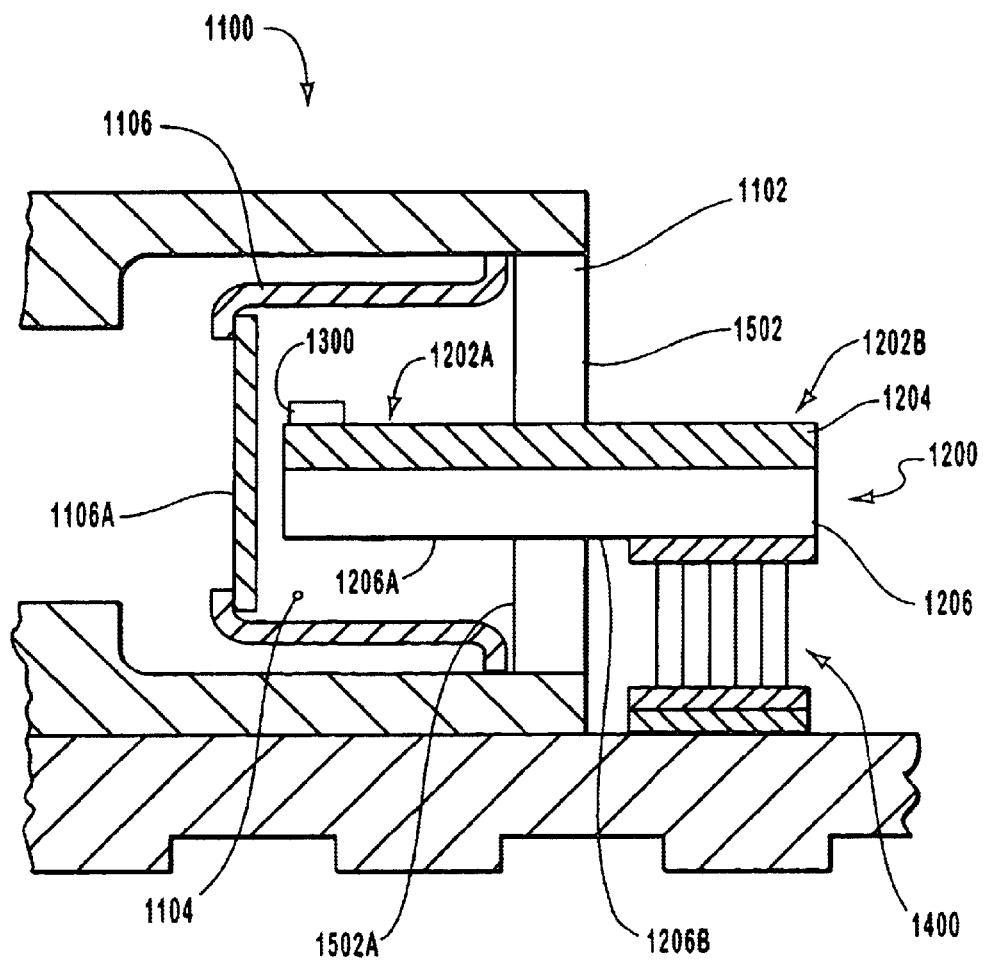
FIG. 4F illustrates various aspects of an alternative platform/TEC configuration where the TEC is located outside the hermetic chamber.

While, as noted earlier in connection with the discussion of FIGS. 4A through 4D, certain effects may be achieved by locating cooling device 900 within hermetic chamber 706, it is nevertheless desirable in some cases to locate the cooling device outside of the hermetic chamber. Aspects of an exemplary embodiment of such a configuration are illustrated in FIG. 4F, where an alternative embodiment of a header assembly is indicated generally at 1100. As the embodiment of the header assembly illustrated in FIG. 4F is similar in many regards to one or more of the embodiments of the header assembly discussed elsewhere herein, the discussion of FIG. 4F will focus primarily on certain selected aspects of the header assembly 1100 illustrated there.

Similar to other embodiments, header assembly 1100 includes a base 1102 having a device side 1102A and a connector side 1102B, through which a platform 1200 passes in a substantially perpendicular orientation. The platform 1200 includes an inside portion 1202A and an outside portion 1202B. One or more electronic devices 1300 are attached to inside portion 1202A of platform 1200 so as to be substantially enclosed within a hermetic chamber 1104 defined by a cap 1106 and base 1102. In the event that electronic device 1300 comprises an optical device, such as a laser, cap 1106 may further comprise an optically transparent portion, or window, 1106A to permit optical signals to be transmitted from and/or received by one or more electronic devices 1300 disposed within hermetic chamber 1104.

With continuing reference to FIG. 4F, platform 1200 further comprises a first feedthrough 1204, upon which electronic devices 1300 are mounted, joined to a second feedthrough 1206 that includes an inside portion 1206A and an outside portion 1206B. The outside portion 1206B of second feedthrough 1206 is, in turn, thermally coupled with a cooling device 1400. In the illustrated embodiment, cooling device 1400 comprises a TEC. However, other types of cooling devices may alternatively be employed.

In operation, heat generated by electronic devices 1300 is transferred, generally by conduction, to second feedthrough 1206. The heat is then removed from feedthrough 1206 by way of cooling device 1400 which, in some embodiments, comprises a TEC. As in the case of other embodiments, a TEC may also be employed, if desired, to add heat to electronic devices 1300.

Thus positioned and arranged, cooling device 1400 is able not only to implement various thermal effects, such as heat removal or heat addition, with respect to electronic devices 1300 located inside or outside hermetic chamber 1104, but also operates to process passive heat loads, which may be conductive, convective and/or radiative in nature, imposed by various components such as the structural elements of header assembly 1500. As noted herein in the context of the discussion of various other embodiments, variables such as, but not limited to, the geometry, placement, and construction materials of platform 1200 and cooling device 1400 may be adjusted as necessary to suit the requirements of a particular application.

Further, by locating the cooling device 900 external to the hermetic chamber, additional space is available in the hermetic chamber for devices such as laser control circuits, laser power supplies, etc.

As suggested earlier, the cooling devices constructed and operated according to the invention may be usefully employed in the context of a laser control system. The laser control system includes a master control circuit, which may be a system that uses, for example, analog feedback or a digital microcontroller or microprocessor using A/D and D/A circuits The master control circuit directly controls two or, in some instances, three outputs. These outputs include the laser output irradiance and the TEC power (through a "power source" or TEC driver). It optionally, in the case of an EML, the master control circuit also controls modulator bias. Feedback to the control system is involves two, or in some instances, three inputs. These inputs include laser launch irradiance detected by means of a monitor photodiode (MPD), or back facet (BF) monitor and laser temperature detected by means of a thermistor or another temperature sensor. The inputs can also include wavelength detected by means of a wavelength locker, using two diodes or another suitable system. The sensors for measuring the inputs are in the header, while the bulk of the control circuit is on an external PCB.

Because the TEC facilitates the transfer of heat from the laser, the laser control system maintains the temperature of the laser below a critical value at which laser performance begins to degrade and reliability becomes an issue. In addition, embodiments of the laser control system of the invention also enable control of the temperature of the laser within a specified range independent of ambient temperature conditions, so as to achieve certain ends such as wavelength stabilization. This permits the laser to be used for a DWDM application, for example.

3. Externally Modulated Lasers Used with Modular Transceivers and Transponders

When designing a transistor header for implementation in a transceiver module, it is desirable to limit the power consumption of the module such that the power consumption is within the specification of a particular standard for which the transceiver is designed. For example, it may be desirable to limit the power consumption of the transceiver to 3.5 W or another specified value to comply with, for example, the XFP standard. This power consumption includes the power required to operate the active devices such as lasers and control circuitry and the power required to actively pump heat away from heat generating devices in the module. The active temperature control, using devices such as a TEC, effectively conducts heat from the active devices within the header so the heat can be dissipated outside of the header using passive cooling devices, such as heat sinks. To stay within the 3.5 W or other specified limits, the TEC or other active cooling system and the heat sinks or other passive cooling devices must cooperate to transfer the thermal energy from the laser, thereby actively controlling the temperature of the laser. The active temperature control provided by the TEC controls wavelength stability of the laser and can enable the operating temperature of the laser to be selected.

The ability to dissipate heat from an assembly utilizing a transistor header via a passive cooling device is dependant on several factors including the materials used in the assembly, the surface area of the materials at various points, the temperature at which the heat generating components operate and the ambient temperature in which the assembly operates. The factors can be summarized by the equation:

$$H = kA\frac{(T_o - T_a)}{L}$$

Where H is the amount of heat transferred, k is a material constant, A is a surface area, $T_o$ is the operating temperature of the transistor header assembly, Ta is the ambient temperature in which the transistor header assembly is operated and L is the length of the passive cooling device. Thus, heat flow is dependant on the temperature differential between the ambient temperature and the operating temperature. As such, if all other factors are held constant, an increase in the operating temperature causes a greater amount of heat to be transferred through the passive cooling device.

In one embodiment of the invention using an EML, although other types of lasers and active devices may be used in similar embodiments, by operating the EML at 40° C., the passive cooling achieved by conducting the heat generated by the laser and other devices such as the laser driver to an external heat sink is increased as compared to operating the embodiment at 25° C. or 30° C. because the differential between the operating temperature and the ambient temperature is increased. Given a certain amount of power dissipation within a header, there is a certain amount of heat that must leave the header and be dissipated into the environment to reach thermal equilibrium. The thermal resistance of the thermal path then determines the temperature difference between the inside of the header and the ambient temperature, according to the equation above. Assuming an ambient environment of 25° C. or so, the laser, while operating, may get up to an idle temperature in the range of 45° C. to 50° C. without any active cooling because of this thermal resistance. If a TEC were used to cool the EML down nearly to the ambient temperature of 25° C., the inefficiencies of the TEC would require very large amounts of power. The power required to operate the TEC can be reduced by cooling the EML from the idle temperature of 45° C. to 50° C. to only 40° C. to 45° C. Thus, the amount of active temperature control that would otherwise be required can be reduced. Alternatively, the active temperature control may be located outside of the transistor header.

While this increase in operating temperature compared to an operating temperature of 25° C. has some effect on the wavelength of the laser beam transmitted by the EML (as well as other operating parameters), this effect can be counteracted by varying the current supplied to the EML or by adjusting the signal to the EML driver. In an alternative embodiment, the EML may be specifically optimized to operate efficiently at 40° C. This optimization can be done by adjusting the electro-absorption band-gap of the modulator when manufacturing the modulator.

Directing attention now to FIG. 5, the illustration shows an EML implemented in a transistor header 2102 wherein the transistor header 2102 is implemented in an optical subassembly 2100. The EML optical subassembly 2100 may be later installed in other components such as a pluggable transceiver module or any other suitable device. The EML optical subassembly 2100 incorporates a transistor header 2102 with a collimating lens assembly 2104, an isolator 2106, and a receptacle 2110.

The subassembly 2100 generally comprises an outer casing 2108 for containing or stabilizing the other components including the transistor header 2102, the collimating lens assembly 2104, the isolator 2106, and the receptacle 2108. The outer casing 2108 may be constructed of any suitable material, such as stainless steel.

In one embodiment of the invention, internal to the casing 2108 and disposed in the transistor header 2102 is a laser diode. The laser diode 2460 may be any laser suitable for the particular application. For example, in a DWDM network, it may be desirable to use EMLs to take advantage of their narrow line width and low chirp values. In applications where precise wavelength control is not required, other types of lasers such as DFB lasers may be used. Alternatively, when the subassembly 2100 is intended to be used as a receiver, a photodiode such as an APD or pin diode or any other suitable diode may be used.

A collimating lens assembly 2104 is optically coupled to the laser diode. The collimating lens assembly 2104 may be any suitable combination of lenses adapted to focus light from the laser diode such that the light can be further propagated in a fiber optic network. In a receiver application when a photo diode is used, the collimating lens assembly 2104 is adapted to focus light from the fiber optic network onto the photo diode.

The isolator 2106 is adapted to prevent back reflection of light into the laser diode. Back-reflections are generally caused when light travels from a medium having a first index of refraction into a medium with a second, different index of refraction. Reflections back into a laser look like another cavity of the laser other than the primary, and destabilize the amplitude and wavelength of the laser light. Certain standards have been developed that specify acceptable amounts of back-reflection. For example, SONET specifications require that a receiver have a back-reflection ratio no greater than −27 dB. Other techniques can be used at the receiver to reduce optical return loss or back reflections, including a variety of index matching and anti-reflection techniques, such as a combination of fiber stubs, angle polished fibers or stubs, anti-reflection coatings, and glass plates.

A receptacle 2110 is optically coupled to the isolator 2106. The receptacle is adapted to couple to other fiber-optic device in a pluggable manner. In one embodiment of the invention, the receptacle complies with the XFP standard receptacle size for implementation in an XFP system, which is an LC fiber-optic cable receptacle. Other common receptacles are the SC and FC connectors.

Further disposed in the transistor header 2102 as described elsewhere above, is a TEC cooler 2112. Also as noted above, the TEC cooler may be removed or replaced with other types of circuits when the subassembly design allows for less cooling, or when there is no need for active wavelength stabilization in, for example, CWDM systems or systems that do not use wavelength division multiplexing.

Figure 6:
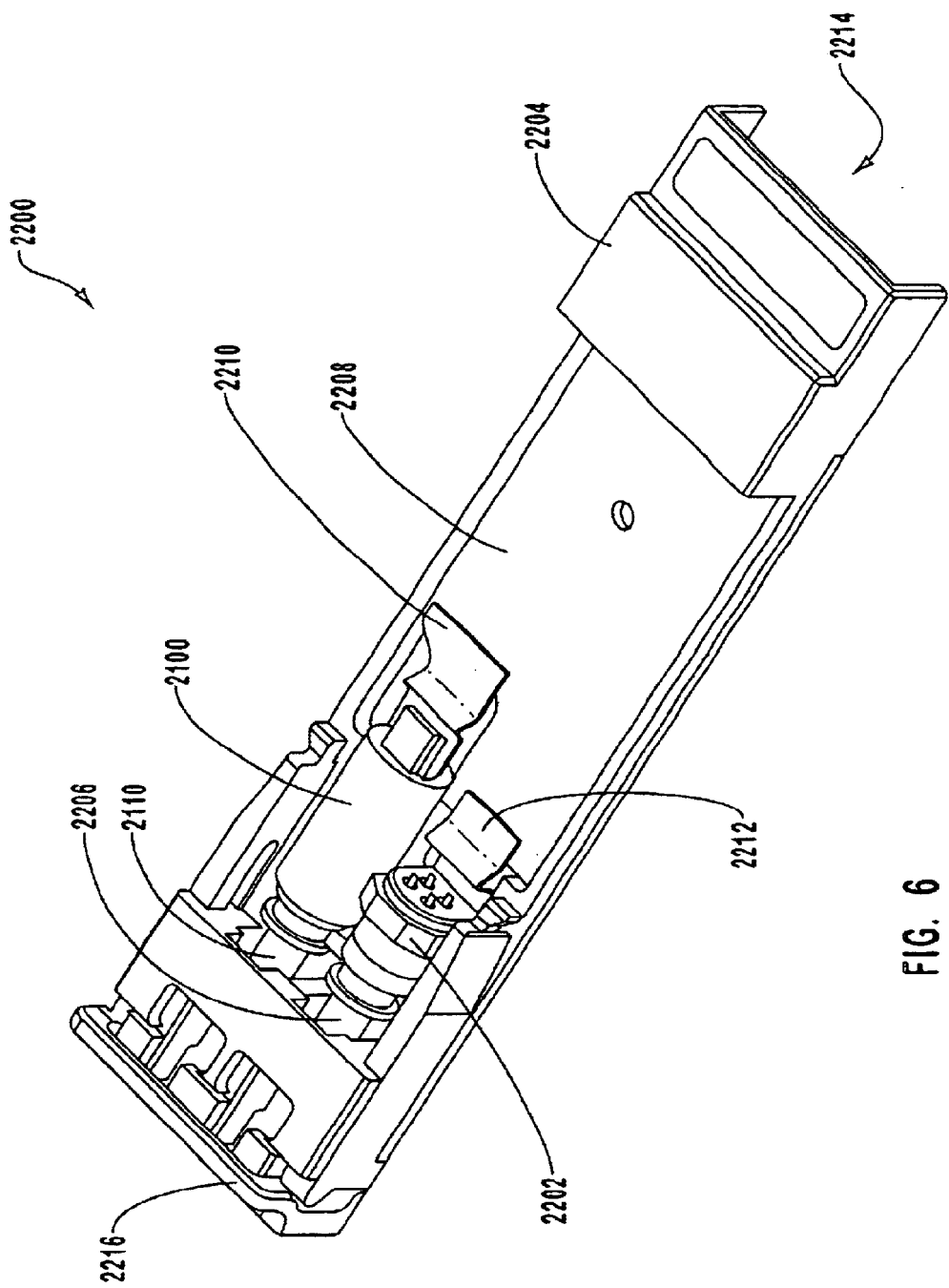
FIG. 6 is a perspective view of a small form factor XFP optical transceiver module having an EML.

FIG. 6 illustrates an embodiment of the invention in which an EML is incorporated into a pluggable transceiver module 2200. The optical transceiver of FIG. 6 conforms to the XFP standard. The transceiver module 2200 incorporates a transmitter optical subassembly 2100 as described in FIG. 6. Additionally, the transceiver module 2200 comprises a receiver subassembly 2202 for receiving optical signals. In one preferred embodiment of the invention, the receiver subassembly 2202 comprises an avalanche photodiode for receiving optical signals. Both the transmitter optical subassembly 2100 and the receiver subassembly 2202 are disposed in a transceiver module casing 2204 so as to be pluggable into interfaces of the same standard. For example, the receptacles 2110 and 2206 are arranged such that their spacing and size are appropriately configured to mate with other XFP components.

The receiver subassembly 2202 and transmitter optical subassembly 2100 are electrically coupled to a module circuit board 2208. The transmitter optical subassembly 2100 and receiver subassembly 2202 may be coupled to the module circuit board 2208 in one embodiment, using flexible circuit boards 2210 and 2212 in an arrangement as shown in FIG. 6. The module circuit board 2208 may comprise various types of circuitry as necessary for the proper operation of the transceiver module 2200. Such circuitry may include protective circuitry, control circuitry, power supply circuitry and so forth. In one embodiment of the invention, the module circuit board 2208 includes an edge connector 2214, placed at the posterior end of the transceiver module, with contacts arranged such that the transceiver module 2200 is pluggable into other circuits within the optical fiber communication network, such as a host system.

The transceiver module may further comprise an advantageous bail release 2216 useful for selectively installing and removing the transceiver module 2200 from an optical network. The bail release is coupled to the anterior end of the transceiver module casing. This feature is especially useful in light of the fact that pluggable standards such as the XFP standard are intended to be hot-pluggable such that there is a need for efficient ways of implementing components without disturbing other components in the optical network resulting in disruption of service by those components. The bail release shown in this example is further described and its advantages set forth in U.S. Pat. No. 6,439,918, issued Aug. 27, 2002, which is incorporated herein by reference.

In one embodiment of the invention, the transceiver module includes a module casing cover (not shown) coupled to the transceiver module casing to enclose the transceiver module. The case cover and the transceiver module casing protect the transceiver module from the ingress of foreign particles or objects.

As such, a transmitter optical subassembly utilizing lasers such as EMLs not previously able to be used in pluggable applications, is effectively implemented. Such transmitter optical subassemblies can be further integrated into optical systems to create a modular optical transmission network with good bandwidth and transmission distance characteristics. Moreover, a transceiver module may be constructed that incorporates EMLs or other lasers for long-range or dense wavelength division multiplexing applications.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A transceiver module for use in a fiber-optic network system comprising:
   a transceiver module casing;
   a receiver subassembly disposed in the transceiver module casing; and
   a transmitter optical subassembly disposed in the transceiver module casing, wherein the transmitter optical subassembly includes a header assembly having enclosed therein:
     a thermoelectric cooler (TEC); and
     a laser capable of transmitting optical data a distance greater than 10 kilometers.

2. A transceiver module as set forth in claim 1, wherein the laser is optimized to operate at a temperature greater than 25 degrees Celsius.

3. A transceiver module as set forth in claim 1, further comprising a bail release coupled to an anterior end of the transceiver module casing.

4. A transceiver module as set forth in claim 1, wherein the transceiver module is constructed so as to comply with one or more of the Small Form-factor, Small Form-factor Pluggable, and 10-Gigabit Small Form-factor Pluggable Multi Source Agreements.

5. A transceiver module as set forth in claim 1, wherein the laser is an externally modulated laser and the distance is in a range of about 10 kilometers to 160 kilometers.

6. A transceiver module as set forth in claim 1, wherein the laser is an externally modulated laser and the distance is in a range of 40 kilometers to 80 kilometers in a 10 Gigabit per second system.

7. A transceiver module as set forth in claim 1, wherein the transmitter optical subassembly comprises a platform having a conductive pathway extending through the platform and wherein a portion of the platform is exposed external to the transmitter optical subassembly.

8. A transceiver module as set forth in claim 7, wherein the conductive pathway comprises a plurality of isolated traces of a sufficient number to at least provide control signals to an integrated circuit laser driver.

9. A transceiver module as set forth in claim 7, wherein the conductive pathway forms a transmission line adapted to match the impedance of a component connected to a first end of the conductive pathway with a source intended to drive the component, wherein the source is indented to be connected to a second end of the conductive pathway.

10. A transceiver module for transmitting fiber optic data in a fiber optic system, the transceiver module comprising:
    a transceiver module casing; and
    a transmitter optical subassembly disposed in the transceiver module casing, wherein the transmitter optical subassembly includes a header assembly having enclosed therein:
      an externally modulated laser (EML) for transmission of optical data a distance greater than 40 kilometers; and
      a thermoelectric cooler (TEC) for cooling the externally modulated laser.

11. A transceiver module as set forth in claim 10, wherein the distance is in a range of 40 kilometers to 160 kilometers.

12. A transceiver module as set forth in claim 10, wherein the externally modulated laser is optimized to operate at a temperature of about 40 degrees Celsius.

\* \* \* \* \*

UNITED STATES PATENT AND TRADEMARK OFFICE
CERTIFICATE OF CORRECTION

PATENT NO. : 6,878,875 B2
APPLICATION NO. : 10/748051
DATED : April 12, 2005
INVENTOR(S) : Aronson et al.

Page 1 of 3

It is certified that error appears in the above-identified patent and that said Letters Patent is hereby corrected as shown below:

Drawings
Sheet 4, replace FIG. 4 with the figure depicted herein below, wherein the thermistor has been labeled --1006--

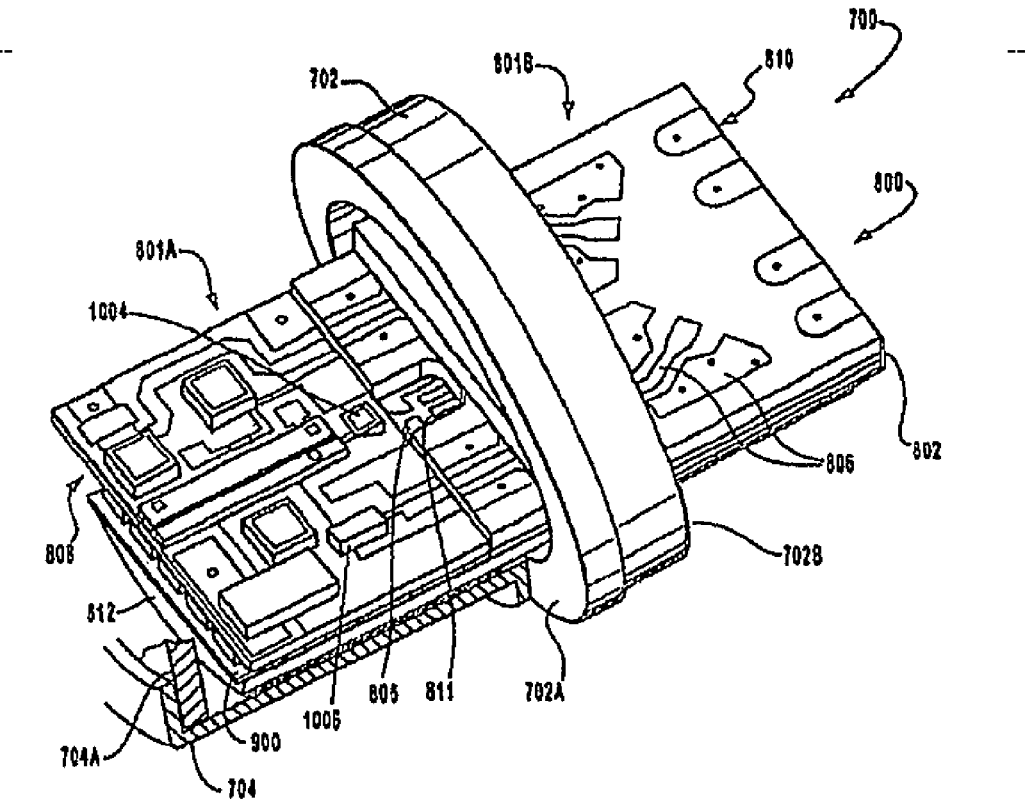

FIG. 4A

Column 3,
Line 42, after "types of" change "laser" to --lasers--
Line 43, after "Semiconductor" change "lasers" to --laser--

Column 5,
Line 60, after "employed" change "present" to --presently--

UNITED STATES PATENT AND TRADEMARK OFFICE
CERTIFICATE OF CORRECTION

PATENT NO. : 6,878,875 B2
APPLICATION NO. : 10/748051
DATED : April 12, 2005
INVENTOR(S) : Aronson et al.

It is certified that error appears in the above-identified patent and that said Letters Patent is hereby corrected as shown below:

Column 8,
Line 6, after "an EML;" remove "and"
Line 40, after "and other systems" insert --,--
Line 49, after "chirp" change "allows" to --allow--

Column 10,
Line 53, after "that matches" insert --the--

Column 11,
Line 12, after "active device" insert --60--

Column 12,
Line 55, after "conductive pathways" change "510" to --610--
Line 59, after "conductive pathways" change "410." to --610.--

Column 14,
Line 15, after "first feedthrough" change "810," to --802,--
Line 60, after "that is mounted" remove "is"

Column 16,
Line 27, change "device 900 results" to --device 900, this results--

Column 18,
Line 36, change "connectors 818." to --connectors 816.--

Column 19,
Line 11, remove "1102A"
Line 12, remove "1102B"
Line 64, after "D/A circuits" insert --.--
Line 67, change "It optionally," to --Optionally,--

Column 20,
Line 2, after "control system" remove "is"

Column 21,
Line 51, before "The outer casing" change "2108." to --2110.--
Line 55, after "laser diode" remove "2460"

UNITED STATES PATENT AND TRADEMARK OFFICE
CERTIFICATE OF CORRECTION

PATENT NO. : 6,878,875 B2
APPLICATION NO. : 10/748051
DATED : April 12, 2005
INVENTOR(S) : Aronson et al.

It is certified that error appears in the above-identified patent and that said Letters Patent is hereby corrected as shown below:

Column 22,
Line 21, before "in a pluggable" change "device" to --devices--

Signed and Sealed this

Eighteenth Day of December, 2007

JON W. DUDAS
*Director of the United States Patent and Trademark Office*